United States Patent
Kanazawa et al.

(10) Patent No.: US 11,687,818 B2
(45) Date of Patent: Jun. 27, 2023

(54) HARDWARE-EFFICIENT CALIBRATION FRAMEWORK FOR QUANTUM COMPUTING DEVICES

(71) Applicant: International Business Machines Corporation, Armonk, NY (US)

(72) Inventors: Naoki Kanazawa, Kanagawa (JP); Kentaro Heya, Kanagawa (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 196 days.

(21) Appl. No.: 17/169,109

(22) Filed: Feb. 5, 2021

(65) Prior Publication Data

US 2022/0253737 A1    Aug. 11, 2022

(51) Int. Cl.
*G06N 10/00* (2022.01)
*H03K 17/92* (2006.01)
*H04L 1/08* (2006.01)

(52) U.S. Cl.
CPC ............. *G06N 10/00* (2019.01); *H03K 17/92* (2013.01); *H04L 1/08* (2013.01)

(58) Field of Classification Search
CPC .......... G06N 10/00; H03K 17/92; H04L 1/08
See application file for complete search history.

(56) References Cited

U.S. PATENT DOCUMENTS

| | | | |
|---|---|---|---|
| 8,089,286 B2 | 1/2012 | Silva et al. | |
| 9,940,212 B2 | 4/2018 | Kelly | |
| 10,360,088 B2 | 7/2019 | Wallman et al. | |
| 2014/0229722 A1 | 8/2014 | Harris | |
| 2018/0225586 A1 | 8/2018 | Chow et al. | |
| 2020/0184023 A1* | 6/2020 | Delaney | G06N 10/20 |
| 2021/0304054 A1* | 9/2021 | Neill | G06F 15/16 |

FOREIGN PATENT DOCUMENTS

| | | | | |
|---|---|---|---|---|
| AU | 2017426939 A1 * | 2/2020 | | G06F 15/80 |
| WO | WO-2019032104 A1 * | 2/2019 | | G06N 10/00 |

OTHER PUBLICATIONS

Sundaresan et al., "Reducing unitary and spectator errors in cross resonance with optimized rotary echoes," arXiv preprint arXiv:2007.02925, 2020, 22 pages.

Sheldon et al., "Characterizing errors on qubit operations via iterative randomized benchmarking," Physical Review A, vol. 93, No. 1, 2016, 012301, 6 pages.

Haeberlen et al., "Coherent averaging effects in magnetic resonance," Physical Review, vol. 175, No. 2, 1968, pp. 453-467.

(Continued)

*Primary Examiner* — Jean B Corrielus
(74) *Attorney, Agent, or Firm* — Amin, Turocy & Watson, LLP

(57) ABSTRACT

Techniques facilitating hardware-efficient calibration protocols for quantum computing devices. In one example, a system can comprise a process that executes computer executable components stored in memory. The computer executable components can comprise an echo pattern component and a pulse component. The echo pattern component can generate an echo sequence based on a Pauli term. The echo sequence can amplify the Pauli term. The pulse component can generate a pulse sequence to calibrate a multi-qubit gate using the echo sequence.

21 Claims, 8 Drawing Sheets

(56) References Cited

OTHER PUBLICATIONS

Cerfontaine et al., "Self-Consistent Calibration of Quantum-Gate Sets," Physical Review Applied, vol. 13, No. 4, 2020, 044071, 15 pages.
Garion et al., "Experimental implementation of non-Clifford interleaved randomized benchmarking with a controlled-S gate," arXiv:2007.08532v1 [quant-ph] Jul. 16, 2020, 9 pages.

* cited by examiner

HARDWARE-EFFICIENT CALIBRATION FRAMEWORK FOR QUANTUM COMPUTING DEVICES

BACKGROUND

One or more embodiments herein relate to quantum computing, and more specifically, to techniques of facilitating hardware-efficient calibration protocols for quantum computing devices.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, devices, computer-implemented methods, and/or computer program products that facilitate hardware-efficient calibration protocols for quantum computing devices are described.

According to an embodiment, a system can comprise a process that executes computer executable components stored in memory. The computer executable components can comprise an echo pattern component and a pulse component. The echo pattern component can generate an echo sequence based on a Pauli term. The echo sequence can amplify the Pauli term. The pulse component can generate a pulse sequence to calibrate a multi-qubit gate using the echo sequence.

According to another embodiment, a computer-implemented method can comprise generating, by a system operatively coupled to a processor, an echo sequence based on a Pauli term that amplifies the Pauli term. The computer-implemented method can further comprise generating, by the system, a pulse sequence to calibrate a multi-qubit gate using the echo sequence.

According to another embodiment, a computer program product for hardware-efficient calibration of quantum computing devices can comprise a computer readable storage medium having program instructions embodied therewith. The program instructions are executable by a processor to cause the processor to perform operations. The operations can include generating, by the processor, an echo sequence based on a Pauli term that amplifies the Pauli term. The operations can further include generating, by the processor, a pulse sequence to calibrate a multi-qubit gate using the echo sequence.

DETAILED DESCRIPTION

Figure 1:
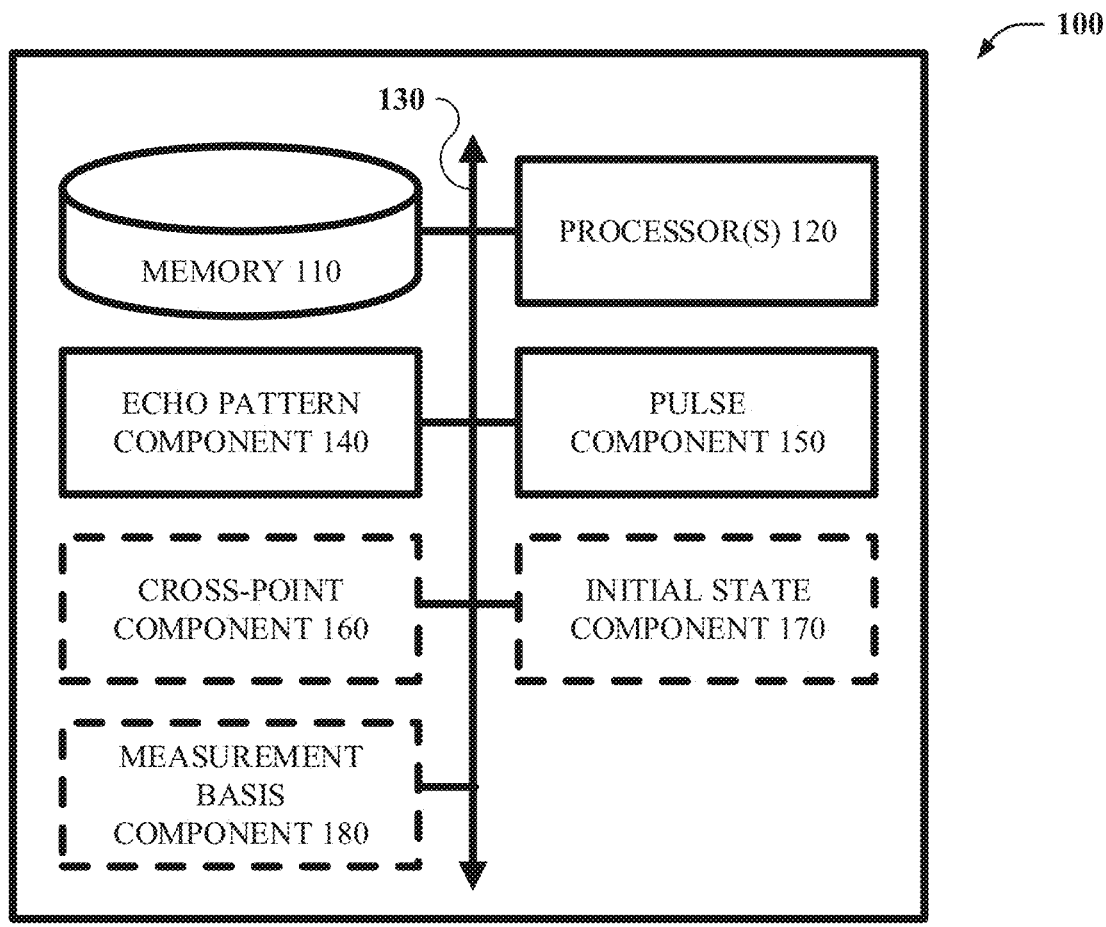
FIG. 1 illustrates a block diagram of an example, non-limiting system that can facilitate hardware-efficient calibration protocols for quantum computing devices, in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

The following definitions are used throughout the present disclosure, unless specifically indicated otherwise. A "cross-resonance gate" denotes a pulse sequence that implements two qubit entangling gates. "Coherent averaging" denotes a technique to suppress unwanted interaction with an echo sequence. An "echo sequence" denotes a repeated pulse sequence to amplify a specific interaction out of a complicated quantum system. "Cross-point calibration" denotes a technique to estimate an optimal parameter by scanning a system parameter to find a cross point of two calibration curves. "Ping-pong calibration" denotes a technique to estimate a strength of interaction by repeating the same pulse sequence. "Maximum clique" denotes a subset of a graph with a maximum number of vertices which are all adjacent to each other. The graph can comprise vertices corresponding to Pauli terms and edges corresponding to commutation relationships between Pauli terms.

Classical computers operate on binary digits (or bits) that store or represent information as binary states to perform computing and information processing functions. In contrast, quantum computing devices operate on quantum bits (or qubits) that store or represent information as both the binary states and superpositions of the binary states. To that end, quantum computing devices utilize quantum-mechanical phenomena, such as entanglement and interference.

A quantum computation uses a qubit as its essential unit instead of a classical computing bit. The qubit (e.g., quantum binary digit) is the quantum-mechanical analog of the classical bit. Whereas classical bits can employ on only one of two basis states (e.g., 0 or 1), qubits can employ on superpositions of those basis states (e.g., $\alpha|0\rangle + \beta|1\rangle$, where $\alpha$ and $\beta$ are complex scalars such that $|\alpha|^2 + |\beta|^2 = 1$), allowing a number of qubits to theoretically hold exponentially more information than a same number of classical bits. Thus, quantum computers (e.g., computers that employ qubits instead of solely classical bits) can, in theory, quickly solve problems that can be extremely difficult for classical computers. The bits of a classical computer are simply binary digits, with a value of either 0 or 1. Almost any device with two distinct states can serve to represent a classical bit: a switch, a valve, a magnet, a coin, etc. Qubits, partaking of the quantum mystique, can occupy a superposition of 0 and 1 states. It's not that the qubit can have an intermediate value, such as 0.63; when the state of the qubit is measured, the result is either 0 or 1. But in the course of a computation, a qubit can act as if it were a mixture of states—for example: 63 percent 0 and 37 percent 1. General quantum programs require coordination of quantum and classical parts of a computation. One way to think about general quantum programs is to identify processes and abstractions involved in specifying a quantum algorithm, transforming the algorithm into executable form, running an experiment or simulation, and analyzing the results. A notion throughout these processes is use of intermediate representations. An intermediate representation (IR) of a computation is neither its source language description nor the target machine instructions, but something in between. Compilers may use several IRs during a process of translating and optimizing a program. The input is source code describing a quantum algorithm and compile time parameter(s). The output is a combined quantum/classical program expressed using a high-level IR. A distinction between a quantum and classical computer is that the quantum computer is probabilistic, thus measurements of algorithmic outputs provide a proper solution within an algorithm specific confidence interval. The computation is then repeated until a satisfactory probable certainty of solution can be achieved. By processing information using laws of quantum mechanics, quantum computers offer novel ways to perform computation tasks such as molecular calculations, financial risk calculations, optimization and many more. However, sensitivity to noise and errors can prohibit near-term quantum computers from outperforming classical computers in performing such computation tasks.

Performance of quantum computing devices continues to improve. Yet, operation of quantum computing devices generally involves frequent calibration generally related to the instability of physical parameters of quantum chips. Deviation of such physical (or control) parameters of a quantum computing device from a calibrated state over time can introduce noise and other sources of error into results obtained from executing quantum circuits on a quantum system.

Mitigating such noise and other sources of error generally involves implementing calibration protocols for a quantum computing device to return the physical or control parameters to a calibrated state. Calibration protocols involving multi-qubit gates can be especially complex and contribute to excessive computational overhead in large-scale quantum systems. For example, a cross-resonance gate (i.e., a pulse sequence that implements two-qubit entangling gates) with a cancellation tone can have, at least, four parameters to calibrate on a relatively frequent basis. Those parameters can include an amplitude and a phase for both the cross-resonance and cancellation tones. Cross-resonance gates with cancellation tones can also involve other parameters, such as frequencies for control and target qubits; pulse lengths; and a length of rise-fall edges. Among those other parameters, pulse lengths and the length of rise-fall edges can be relatively stable in some instances. Frequencies for control and target qubits can be calibrated in the context of single qubit gate calibrations. As such, frequencies for control and target qubits are generally not counted as calibration parameters of cross-resonance gates.

Because a pulse sequence calibrating a cross-resonance gate can depend on such parameters to calibrate, a calibration controller (controller unit) for a quantum computing device generally preloads the pulse sequence into an instruction buffer for each calibration experiment. Preloading the pulse sequence into the instruction buffer can represent increased computational overhead for the controller unit in terms of memory resources and/or communication bandwidth. In addition, some calibration protocols such as ping-pong calibration can utilize a sinusoidal function to extract an error factor from a calibration experiment result. An optimizer loop involved in utilizing the sinusoidal function can represent increased computational overhead for the controller unit in terms of processing resources and/or memory resources. The increased computational overhead associated with such calibration protocols can negatively impact scalability of quantum computing devices.

Embodiments of the present disclosure describe techniques of facilitating hardware-efficient calibration protocols for quantum computing devices. In accordance with one or more embodiments described herein, aspects of coherent averaging techniques can be expanded upon to automatically generate an echo sequence that amplifies a specific Pauli term while suppressing other Pauli terms. As described in greater detail below, embodiments of the present disclosure can generate echo sequences based on the commutation and/or anti-commutation of selected Pauli terms. This aspect of the present disclosure can facilitate applying embodiments of the disclosed techniques to quantum systems expressed by Pauli terms without loss of generality.

In some embodiments, cross-point calibration can be leveraged to further increase efficiency by identifying an optimal pulse parameter within a parameter scan range. For example, embodiments of the present disclosure can leverage cross-point calibration to identify an optimal pulse parameter using linear fitting rather than computationally expensive trigonometric fitting implemented by other calibration protocols. As such, embodiments of the present disclosure provide techniques of facilitating hardware-efficient calibration protocols for quantum computing devices. More efficient calibration protocols can positively impact scalability of quantum computing devices.

FIG. 1 illustrates a block diagram of an example, non-limiting system 100 that can facilitate hardware-efficient calibration protocols for quantum computing devices, in accordance with one or more embodiments described herein. System 100 includes memory 110 for storing computer-executable components and one or more classical processors 120 operably coupled via one or more communication busses 130 to memory 110 for executing the computer-executable components stored in memory 110. As shown in FIG. 1, the computer-executable components can include an echo pattern component 140 and a pulse component 150.

Echo pattern component 140 can generate an echo sequence based on a Pauli term that amplifies the Pauli term. In an embodiment, the Pauli term can be determined for an input calibration parameter using a hardcoded lookup table. In an embodiment, echo pattern component 140 can generate the echo sequence using a commutation set comprising the Pauli term and a plurality of Pauli terms that each commute with the Pauli term, as described in greater detail with reference to FIG. 5. In an embodiment, at least one Pauli term within the plurality of Pauli terms anti-commutes with remaining Pauli terms in the plurality of Pauli terms. In an embodiment, echo pattern component 140 can generate the echo sequence using a reduced commutation set comprising a subset of a commutation set. In an embodiment, the reduced commutation set can facilitate reducing a length of the echo sequence. Pulse component 150 can generate a pulse sequence for calibrating a multi-qubit gate using the echo sequence, as described in greater detail with reference to FIG. 4.

In an embodiment, the computer-executable components stored in memory 110 further can include cross-point component 160, initial state component 170, and/or measurement basis component 180. Cross-point component 160 can identify a pulse parameter (e.g., an optimal pulse parameter) within a parameter scan range using a cross point between a pair of calibration curves. In an embodiment, cross-point component 160 can further reduce an error associated with the pulse parameter by increasing a number of echo sequence repetitions and reducing the parameter scan range. Initial state component 170 can determine a pair of initial stabilizer states using the Pauli term. In an embodiment, initial state component 170 can determine the pair of initial stabilizer states by selecting probe and controller qubits with different initial states depending on the Pauli term. In this embodiment, the controller qubit can have two initial states corresponding to different eigenvalues of the Pauli term to supply two calibration curves to cross-point component 160. Measurement basis component 180 can determine a projection basis of a qubit using the Pauli term. The functionality of the computer-executable components utilized by the embodiments will be covered in greater detail below.

Figure 2:
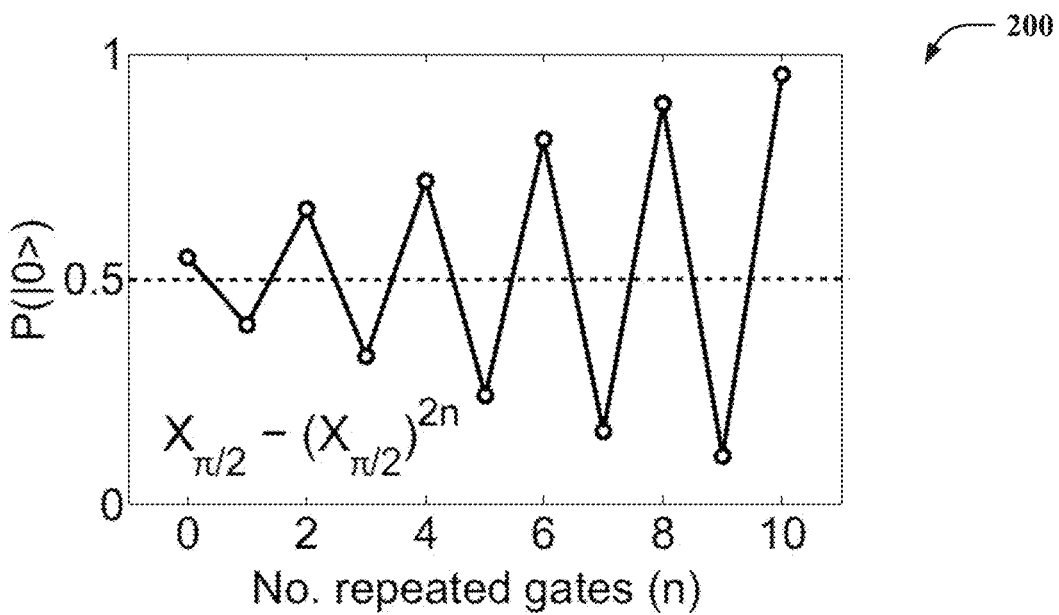
FIG. 2 illustrates an example, non-limiting graph depicting a pulse amplitude calibration for a $\pi/2$ ($X_{\pi/2}$) pulse about an x-axis using ping-pong calibration.

FIG. 2 illustrates an example, non-limiting graph 200 depicting a pulse amplitude calibration for a π/2 ($X_{\pi/2}$) pulse about an x-axis using ping-pong calibration. Ping-pong calibration involves tuning up the pulse amplitude of the $X_{\pi/2}$ pulse by repeating the pulses in an error amplification sequence of $X_{\pi/2}-(X_{\pi/2})^{2n}$, where n denotes a number of repeated gates. As shown by FIG. 2, an initial estimate for the pulse amplitude of the $X_{\pi/2}$ pulse has some error, which the error amplification sequence amplifies so the deviation from 0.5 grows with n.

Figure 3:
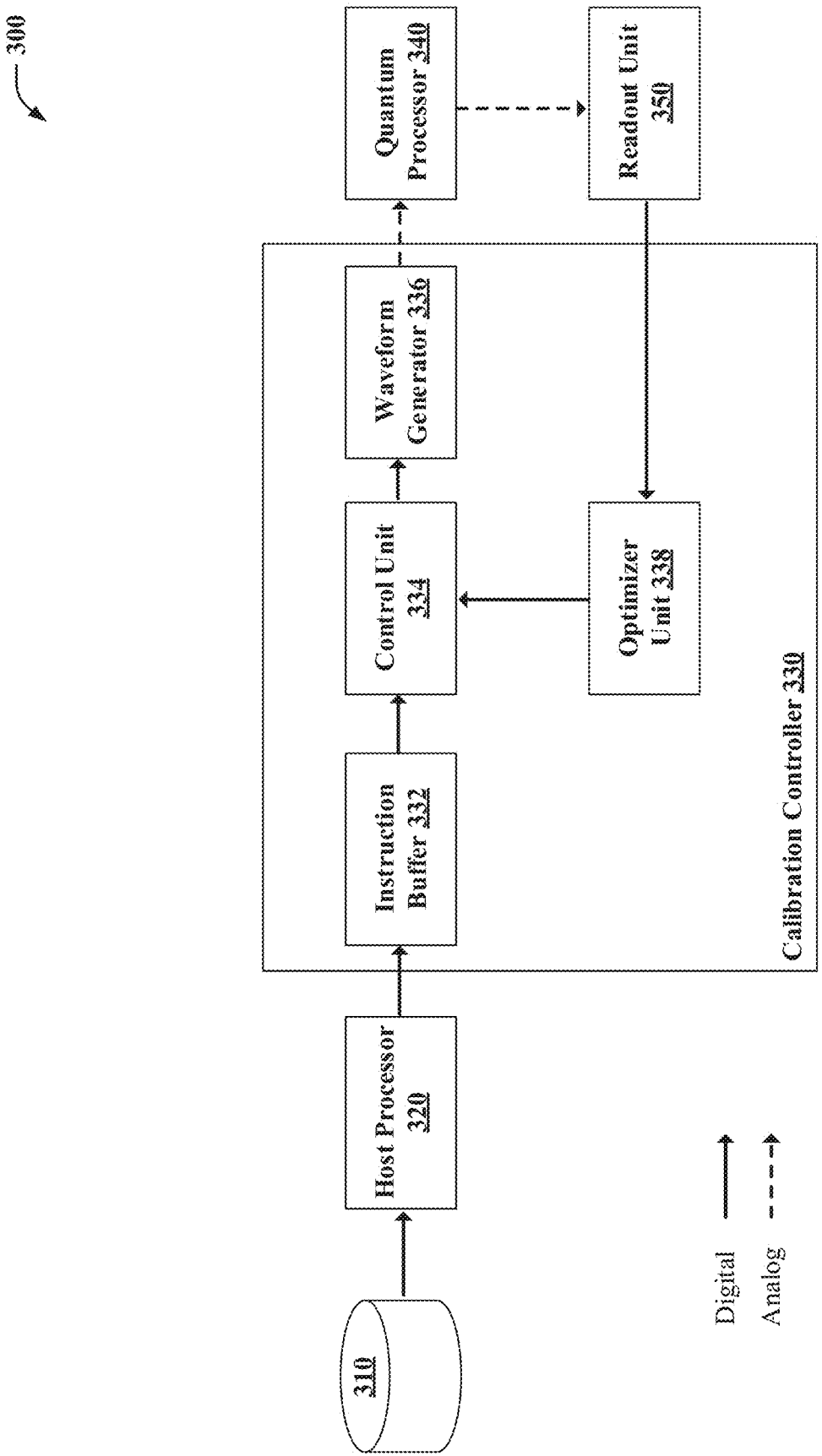
FIG. 3 illustrates a block diagram of an example, non-limiting system for calibrating quantum computing devices.

FIG. 3 illustrates a block diagram of an example, non-limiting system 300 for calibrating quantum computing devices using ping-pong calibration. As shown by FIG. 3, system 300 includes a database 310, a host processor 320, a calibration controller 330 for a quantum computing device, a quantum processor 340, and a readout unit 350. In operation, host processor 320 can call (or retrieve) an entire calibration program from database 310 and load (or preload) that program into an instruction buffer 332 of calibration controller 330. The calibration program can be created with domain knowledge pertaining to the quantum computer device (e.g., quantum processor 340) being calibrated. In an embodiment, creating a calibration program with domain knowledge can include an entity (e.g., a subject matter expert) preparing a qubit in an initial state that is sensitive to a given parameter error and designing a sequence that accumulates the given parameter error. The entity can project the qubit into a particular measurement basis having increased sensitivity to that accumulated error.

By way of example, host processor 320 can load a calibration program for calibrating a cross-resonance amplitude error parameter into instruction buffer 332. As another example, host processor 320 can load the calibration program for calibrating a cross-resonance phase error parameter of quantum processor 340 presented below in the pseudocode of Algorithm 1:

Algorithm 1

$$\left[\begin{array}{l}\text{Play}\{X90, DriveChannel1\} \\ \text{Play}\{ZX45_+, ControlChannel0\} \\ \text{Play}\{X, DriveChannel0\} \\ \text{Play}\{ZX45_-, ControlChannel0\} \\ \text{Play}\{X, DriveChannel0\} \\ \text{Play}\{Y, Drivechannel1\} \\ \text{Play}\{Y90, DriveChannel1\} \\ \text{Measure}\{MeasureChannel1\} \\ \text{Acquire}\{AcquireChannel1, MemorySlot1\}\end{array}\right\} \text{Repeat } N \text{ times}$$

Control unit 334 can retrieve the calibration program from instruction buffer 332 and translate or decode the calibration program to generate control signals for waveform generator 336. Waveform generator 336 can generate a radio frequency (RF) signal or other control stimuli comprising shaped microwave control pulses using the control signals that control unit 334 generates using the calibration program. Quantum processor 340 can be manipulated by application of the RF signal to enact the desired state-transformations and/or measurements of qubits comprising quantum processor 340. Such manipulation can involve a number of echo sequence repetitions on quantum processor 340 that is defined by the calibration program retrieved from instruction buffer 332.

Readout unit 350 can observe signals output by quantum processor 340 responsive to application of the RF signal generated by waveform generator 336. Readout unit 350 can further convert the observed signals into counts data through a sequence of transformations. The sequence of transformations can include converting the observed signals into raw data that corresponds to a digitized time-series representation of the observed signals. The sequence of transformations can also include converting raw data into kerneled data that corresponds to complex values that can encode qubit state information. Converting raw data into kerneled data can involve removing time dependency aspects of the raw data to obtain the complex values. The sequence of transformations can further include applying a discriminator to kerneled data to obtain discriminated data that can classify qubit state information. For example, the kerneled data obtained using a kernel process can be output to a discriminator as points in an in-phase and quadrature (IQ) plane that encode states of a qubit. The discriminator can use the points in the IQ plane to classify a state of the qubit. Counts data can include raw data, kerneled data, and/or disciminated data.

Optimizer unit 338 can utilize ping-pong calibration or another trigonometric fitting technique including, but not limited to, cross resonance Hamiltonian tomography to extract a parameter error from counts data obtained from readout unit 350. To that end, optimizer unit 338 can include a math library comprising one or more fit functions that can fit counts data with a particular fit function. The one or more fit functions can include: a sinusoidal or other trigonometric function, an exponential function, a Gaussian function, a Lorentzian function, or other fit functions. In an embodiment, the particular fit function can be selected from among the one or more fit functions based using a parameter being measured. Ping-pong calibration generally involves measuring counts at each repetition number n. The measured counts can be converted into a measured population by dividing the measured counts by a number of measurement shots to obtain initial parameter and fit bounds. The measured population can correspond to 0.5 when no parameter error is present. The measured population can deviate from 0.5 to form a "ping-pong" pattern when a finite parameter error is present. For example, the finite parameter error can correspond to a rotation angle error from a target rotation angle of $\pi/2$. Optimizer unit 338 can further extract an error coefficient from that fit and determine a parameter error from the error coefficient. Optimizer unit 338 can update a corresponding parameter with control unit 334 using the parameter error via a parameter feedback mechanism. By way of example in which the parameter error relates to a rotation angle error from a target rotation angle, the parameter feedback mechanism can involve converting the rotation angle error into an amplitude value. In this example when the rotation angle error is positive, optimizer unit 338 can coordinate with control unit 334 to reduce an amplitude parameter stored in instruction buffer 332 by the amplitude value. Alternatively, when the rotation angle error is negative, optimizer unit 338 can coordinate with control unit 334 to increase the amplitude parameter stored in instruction buffer 332 by the amplitude value. Control unit 334 can reload the calibration program stored in instruction buffer 332 and update one or more pulse definitions in control signals generated for waveform generator 336 using the updated parameter information.

Figure 4:
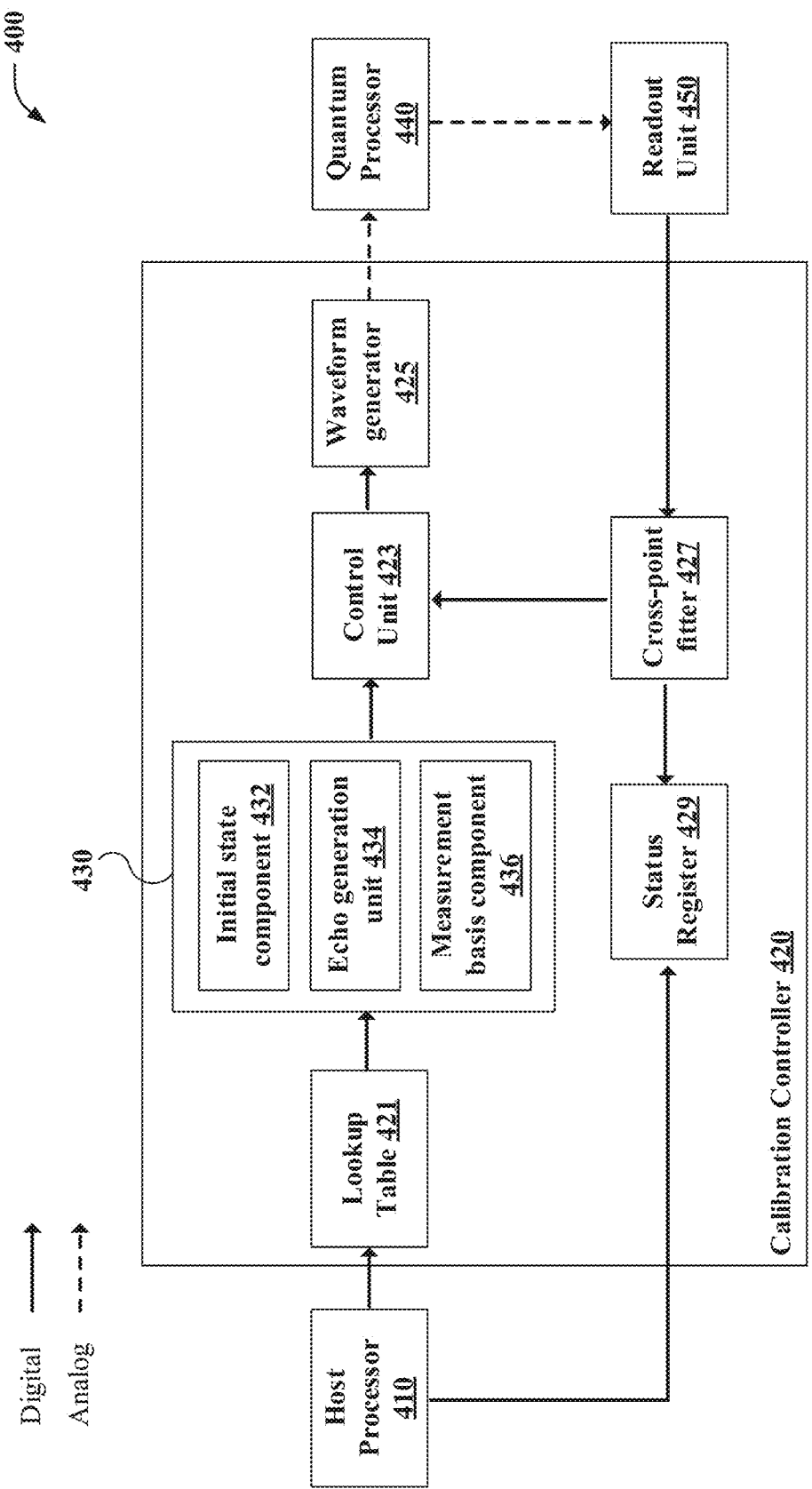
FIG. 4 illustrates a block diagram of an example, non-limiting system for calibrating quantum computing devices using echo sequence calibration, in accordance with one or more embodiments described herein.

FIG. 4 illustrates a block diagram of an example, non-limiting system 400 for calibrating quantum computing devices using echo sequence calibration, in accordance with one or more embodiments described herein. As shown by FIG. 4, system 400 includes a host processor 410, a calibration controller 420, a quantum processor 440, and a readout unit 450. In operation, host processor 410 can issue a label or an input calibration parameter (e.g., a pulse parameter corresponding to an error to be mitigated by calibration) to calibration controller 420. In an embodiment, communication between host processor 410 and calibration controller 420 can utilize a label (e.g., CR_phase) of a calibration parameter. In this embodiment, host processor 410 does not need to know a mapping between a calibration parameter and a target Pauli term.

Calibration controller 420 can generate control fields or control stimuli comprising shaped control pulses for manipulating quantum processor 440 based on input calibration parameters issued by host processor 410. Examples of control fields or control stimuli include RF signals, lasers for ion traps, or other control stimuli. To that end, calibration controller 420 can include lookup table 421, control unit 423, waveform generator 425, cross-point fitter 427, status register 429, and sequence generator component 430. In an embodiment, waveform generator 425 and/or cross-point fitter 427 can be implemented using pulse component 150 and/or cross-point component 160 of FIG. 1, respectively. Lookup table 421 can be a hardcoded lookup table that can determine a target Pauli term or Pauli term for an input calibration parameter issued by host processor 410. By way of example, host processor 410 can issue an input calibration parameter corresponding to a cross resonance phase error. In this example, lookup table 421 can determine a ZY Pauli term for that input calibration parameter. In an embodiment, a Pauli term for an input calibration parameter can be determined using a quantum process tomography experiment. In this embodiment, determining the Pauli term using the quantum process tomography experiment can facilitate fully automating system 400.

A sequence generator unit 430 can dynamically generate pulse sequences that facilitate pulse shape calibrations. To that end, sequence generator unit 430 can include initial state component 432, echo generation component 434, and measurement basis component 436. In an embodiment, initial state component 432, echo generation component 434, and/or measurement basis component 436 can be implemented using initial state component 170, echo pattern component 140, and/or measurement basis component 180 of FIG. 1, respectively. Sequence generator unit 430 can transfer a labels tuple for each qubit associated with an input calibration parameter to control unit 423. Each label tuple can comprise an initial stabilizer state element, an echo sequence element, and a projection basis element.

Initial state component 432 can determine a pair of initial stabilizer states ($\psi\pm$) corresponding to a target Pauli term. Determining the pair of initial stabilizer states can include identifying, by initial state component 432, an initial stabilizer state corresponding to a probe qubit and an initial stabilizer state corresponding to a controller qubit. The initial stabilizer state corresponding to the probe qubit can comprise non-eigenstates of a Pauli operator of the target Paul term associated with the probe qubit. The initial stabilizer state corresponding to the controller qubit can comprise $\pm 1$ eigenstates of a Pauli operator of the target Paul term associated with the controller qubit. Initial state component 432 can generate two sets of initial state information for cross-point calibration using the $\pm 1$ eigenstates of the Pauli operator of the target Paul term associated with the controller qubit.

Echo generation component 434 can implement an echo generation process to generate an echo sequence that amplifies a target Pauli term (or Pauli term) based on the target Pauli term determined by lookup table 421. An example, non-limiting echo generation process will be described in greater detail below with respect to FIG. 5. Measurement basis component 436 can determine a projection basis of a probe qubit using the target Pauli term. The projection basis can define a basis for measuring a state outcome of the probe qubit. In an embodiment, measurement basis component 436 can determine a projection basis that is associated with increased sensitivity to an error to be mitigated by calibration. The projection basis can be an axis of another eigenbasis used for state initialization. By way of example, a controller qubit can be initialized in one of eigenbasis of X. Because the controller qubit is initialized in one eigenbasis of X and ZY rotation can be accumulated as Z rotation on a probe qubit, rotation angle error can appear as a relatively small offset from an X axis. Maximizing sensitivity can involve measuring in a Y basis so that tilt from the X axis can be detected in an orthogonal axis. In this example, maximizing sensitivity cannot involve measuring in a Z basis because the ZY rotation is accumulated as rotation about a Z axis.

Continuing with the example above regarding the ZY Pauli term, sequence generator unit 430 can select a probe qubit in which an error associated with the ZY Pauli term is accumulated. In an embodiment, the probe qubit can be selected arbitrarily and an initial state and/or measurement basis can be chosen based on that arbitrary selection. In the preceding example, initial state component 432 can determine a first initial stabilizer state corresponding to the probe qubit and a second stabilizer state corresponding to an associated controller qubit. The first initial stabilizer state can comprise non-eigenstates of a Z-Pauli operator (e.g., $|+\rangle$ ([XP, XM])), where XP denotes $|+\rangle$ state along an X axis and XM denotes $|-\rangle$ state along the X axis. The second initial stabilizer state can comprise ±1 eigenstates of a Y-Pauli operator (e.g., $|+i\rangle$, $|-i\rangle$ ([YP, YM])), where $|+i\rangle$ and $|-i\rangle$ (or $|\circlearrowright\rangle$ and $|\circlearrowleft\rangle$) denote names of eigenstates along a Y axis, YP denotes the $|+i\rangle$ or $|\circlearrowright\rangle$ state along the Y axis, and YM denotes $|-i\rangle$ or $|\circlearrowleft\rangle$ state along the Y axis.

Continuing with the preceding example, echo generation component 434 can implement an echo generation process to generate the following echo sequence based on the ZY Pauli term: [ZY, XX, ZY, XZ, ZY, XX, ZY, XZ]. Measurement basis component 436 can determine a projection basis corresponding to the ZY Pauli term. In determining the projection basis, measurement basis component 436 can consider that the apparent dynamics of the ZY Pauli term on the probe qubit is +Z or −Z rotation depending on an initial state of the associated controller qubit. As such, measurement basis component 436 can determine ([Y, Y]) as the projection basis that is associated with increased sensitivity to erroneous Z rotation.

In this example, sequence generator unit 430 can transfer first and second labels tuples to control unit 423 for the probe and associated controller qubits, respectively. The first labels tuple can comprise: (i) an initial stabilizer state element of [XP, YP] from the pair of initial stabilizer states determined by initial state component 432; (ii) an echo sequence element of [ZY, XX, ZY, XZ, ZY, XX, ZY, XZ] generated by echo generation component 434; and a projection basis element of [Y, --] from the projection basis determined by measurement basis component 436. The second labels tuple can comprise: (i) an initial stabilizer state element of [XP, YM] from the pair of initial stabilizer states determined by initial state component 432; (ii) an echo sequence element of [ZY, XX, ZY, XZ, ZY, XX, ZY, XZ] generated by echo generation component 434; and a projection basis element of [Y, --] from the projection basis determined by measurement basis component 436.

Control unit 423 can convert labels tuples received from sequence generator unit 430 into instruction data. The instruction data can comprise an instruction indicative of a pulse for a corresponding label comprising the labels tuples. Control unit 423 can further schedule instructions within the instruction data to create scheduled instruction data (e.g., a pulse sequence). Control unit 423 can transmit the scheduled instruction data to waveform generator 425 for generating control fields or control stimuli comprising shaped control pulses that manipulate quantum processor 440.

Waveform generator 425 can generate control fields or control stimuli comprising shaped control pulses for manipulating quantum processor 440 based on scheduled instruction data received from control unit 423. In an embodiment, waveform generator 425 can parametrize irradiating pulse shapes of control pulses such that waveform generator 425 can dynamically adjust such control pulses on the fly based on optimal pulse parameter information received from cross-point fitter 427 via a feedback mechanism. In this embodiment, waveform generator 425 can comprise a parameter table that includes a target pulse corresponding to a given instruction comprising the scheduled instruction data received from control unit 423. The parameter table can further include one or more parameters describing a given target pulse. For example, a quantum processor is generally stimulated with a Gaussian flat-topped pulse to create a cross-resonance gate. In this example, the parameter table can include a Gaussian flat-topped pulse corresponding to a cross-resonance gate instruction. The parameter table of this example can further include one or more parameters (e.g., duration, amplitude, rise-fall sigma, and/or rise-fall length) describing a Gaussian flat-topped pulse. Upon receiving scheduled instruction data from control unit 423 that includes a cross-resonance gate instruction, waveform generator 425 can generate control fields or control stimuli comprising the Gaussian flat-topped pulse on the fly using the one or more parameters of the parameter table that describe the Gaussian flat-topped pulse. In this embodiment, cross-point fitter 427 can update parameters stored in the parameter table based on parameter errors determined using a cross-point calibration process, as described in greater detail below. In an embodiment, parameters describing target pulses can be appended to scheduled instruction data received from control unit 423. In this embodiment, cross-point fitter 427 can feed parameter data to control unit 423 using parameter errors determined using a cross-point calibration process that is described in greater detail below.

Cross-point fitter 427 can implement a cross-point calibration process to identify optimal pulse parameters for input calibration parameters received from host processor 410. Example, non-limiting cross-point calibration processes will be described in greater detail below with respect to FIGS. 6-7. In an embodiment, cross-point fitter 427 can utilize a heuristic search to facilitate reducing a number of experiments involved in finding an optimal cross point. Host processor 410 can poll status register 429 for calibration-related data written to status register 429 by cross-point fitter 427. Examples of calibration-related data include information regarding the status (e.g., currently executing or successfully completed) of a given calibration protocol initiated by host processor 410 issuing a particular input calibration parameter, information regarding any errors encountered while executing the given calibration protocol, and the like.

Quantum processor 440 comprises quantum hardware that facilitates implementing multi-qubit gates when manipulated by control fields or control stimuli applied by waveform generator 425. Application of such control fields or control stimuli can enact desired state-transformations and/or measurements of qubits comprising quantum processor 440. Readout unit 450 can observe signals output by quantum processor 440 responsive to application of the control fields or control stimuli generated by waveform generator 425. Readout unit 450 can further convert the observed signals into counts data through a sequence of transformations. The sequence of transformations can include converting the observed signals into raw data that corresponds to a digitized time-series representation of the observed signals. The sequence of transformations can also include converting raw data into kerneled data that corresponds to complex values that can encode qubit state information. Converting raw data into kerneled data can involve removing time dependency aspects of the raw data to obtain the complex values. The sequence of transformations can further include applying a discriminator to kerneled data to obtain discriminated data that can classify qubit state information. For example, the kerneled data obtained using a kernel process can be output to a discriminator as points in an IQ plane that encode states of a qubit. The discriminator can use the points in the IQ plane to classify a state of the qubit. Counts data can include raw data, kerneled data, and/or discriminated data.

Figure 5:
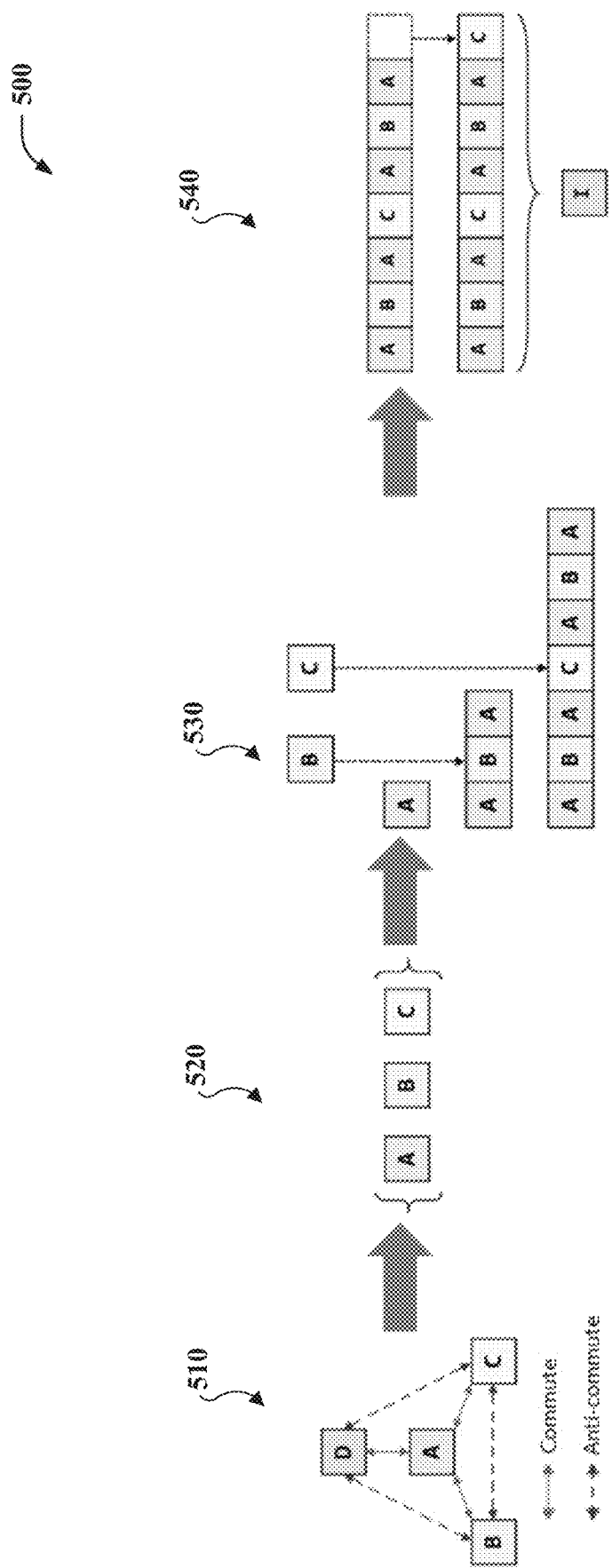
FIG. 5 illustrates an example, non-limiting echo generation process, in accordance with one or more embodiments described herein.

FIG. 5 illustrates an example, non-limiting echo generation process 500, in accordance with one or more embodiments described herein. As shown by FIG. 5, echo generation process 500 can include a sub-process 510 that receives a target Pauli term (Pauli term A) for an input calibration parameter (e.g., a pulse parameter corresponding to an error to be mitigated by calibration). In an embodiment, the target Pauli term can be an arbitrary Pauli term. In an embodiment, the target Pauli term can be determined for an input calibration parameter using a hardcoded lookup table (e.g., lookup table 421 of FIG. 4).

Sub-process 510 can build a commutation set by determining a group of Pauli terms that commute with the target Pauli term and anti-commute with each other. In FIG. 5, sub-process 510 built the commutation set comprising the target Pauli term (Pauli term A) and a group of Pauli terms that includes Pauli terms B, C, and D. As such, Pauli terms B, C, and D each commute with Pauli term A. Moreover, Pauli term B anti-commutes with Pauli terms C and D; Pauli term C anti-commutes with Pauli terms B and D; and Pauli term D anti-commutes with Pauli terms B and C. In an embodiment, the group of Pauli terms comprising the commutation can be a maximum clique.

A number of Pauli terms N comprising the group of Pauli terms can be set using the relationship $N=2n-1$, where n denotes the number of qubits in the interaction associated with the input calibration parameter. For example, the input calibration parameter corresponding to the target Pauli term (Pauli term A) that sub-process 510 receives can correspond to a phase parameter for a cross-resonance gate. In this example, the cross-resonance gate associated with that input calibration parameter is a pulse sequence that implements two-qubit entangling gates. As such, the group of Pauli terms that sub-process 510 determined for that input calibration parameter associated with a two-qubit interaction includes [2(2)−1] or 3 Pauli terms (i.e., Pauli terms B, C, and D).

Echo generation process 500 can further include a sub-process 520 that selects a subset of Pauli terms comprising a commutation set built by sub-process 510 to form a reduced commutation set. In an embodiment, a reduced commutation set can facilitate reducing a length of a corresponding echo sequence. A reduced commutation set can include a target Pauli term and a reduced group of Pauli terms that commute with the target Pauli term and anti-commute with each other. The reduced group of Pauli terms can include 2n−2 Pauli terms, where n denotes the number of qubits in the interaction associated with the input calibration parameter.

Continuing with the example above in which sub-process 510 receives the target Pauli term for the input calibration parameter associated with the two-qubit interaction, the reduced group of Pauli terms comprising the reduced commutation set formed by sub-process 520 can include [2(2)−2] or 2 Pauli terms (e.g., Pauli terms B and C). In an embodiment, remaining Pauli terms of the group of Pauli terms that are not selected by sub-process 520 for inclusion in the reduced commutation set (e.g., Pauli term D) can linearly depend on the reduced group of Pauli terms (e.g., Pauli terms B and C) selected for inclusion in the reduced commutation set.

Sub-process 530 of echo generation process 500 can sequentially arrange a reduced commutation set of Pauli terms to form a sequence of Pauli terms. In an embodiment, sequentially arranging the reduced commutation set can comprise inserting sequentially arranged Pauli terms of a reduced group of Pauli terms included in the reduced commutation set into the sequence of Pauli terms such that each Pauli term of the reduced group of Pauli terms intervenes between two iterations of the target Pauli term. For example, sub-process 530 can form the sequence of Pauli terms depicted in FIG. 5 using the reduced commutation set formed by sub-process 520. In this example, that sequence of Pauli terms includes Pauli terms B and C of the reduced group of Pauli terms sequentially arranged in the sequence of Pauli terms. Each instance of Pauli term B or Pauli term C intervenes between two iterations of the target Pauli term (Pauli term A).

Sub-process 540 of echo generation process 500 can append a final Pauli term to a sequence of Pauli terms to generate an echo sequence. The final Pauli term that sub-process 540 appends to the sequence of Pauli terms can be determined by identifying a Pauli term that renders the generated echo sequence unitary. In some instances, the Pauli term that renders the generated echo sequence unitary can be a last Pauli term in a reduced group of Pauli terms comprising a reduced commutation set. In some instances, other Pauli terms can render the generated echo sequence unitary.

Figure 6:
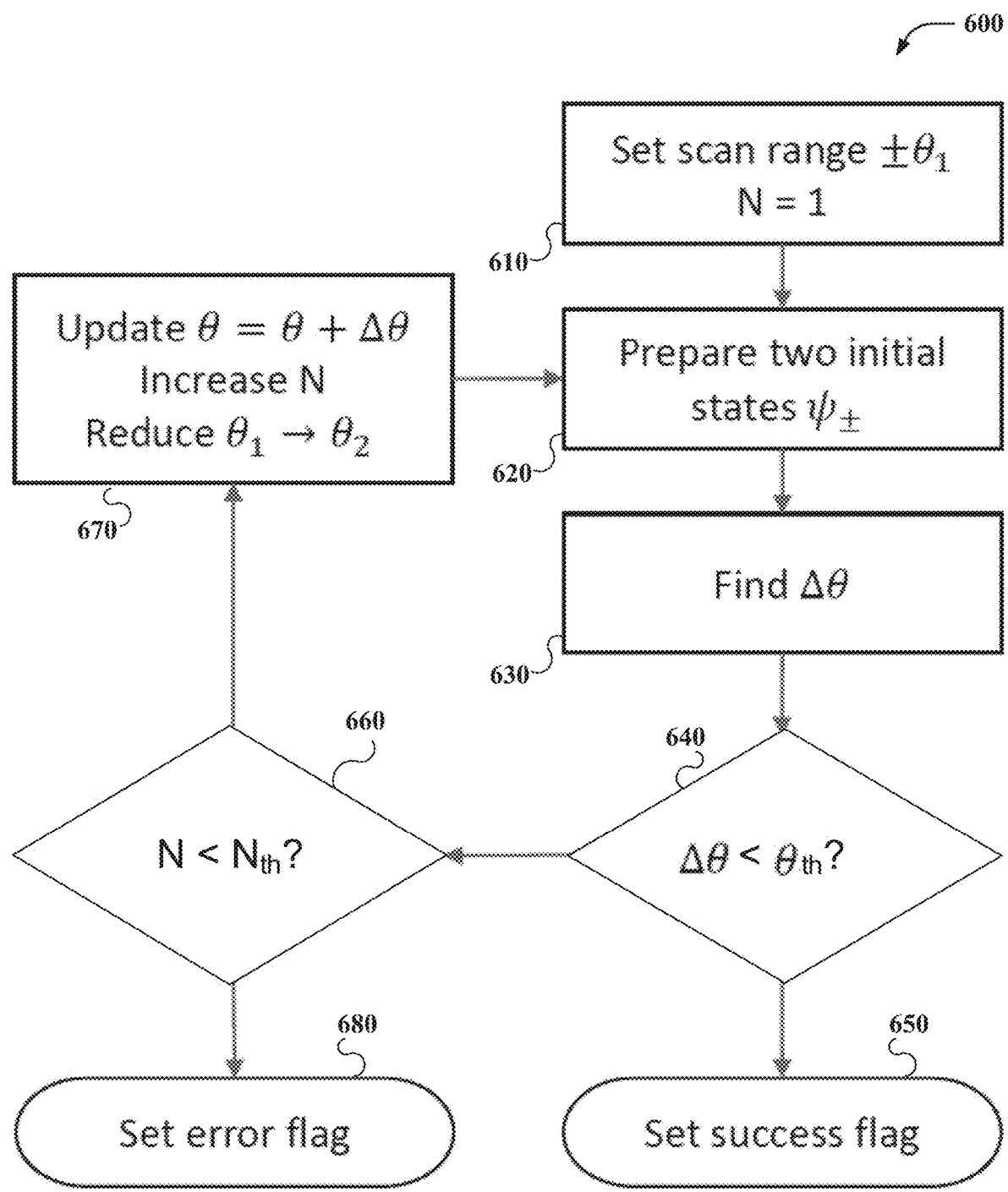
FIG. 6 illustrates an example, non-limiting operational flow for implementing cross-point calibration, in accordance with one or more embodiments described herein.

FIG. 6 illustrates an example, non-limiting operational flow 600 that system 400 of FIG. 4 can implement to perform cross-point calibration, in accordance with one or more embodiments described herein. At 610, cross-point fitter 427 can set a number of echo sequence repetitions at one for a first scanning iteration. Cross-point fitter 427 can further set a parameter scan range for the first scanning iteration, at 610. Cross-point fitter 427 can set the parameter scan range by: defining a lower bound of the parameter scan range, defining an upper bound of the parameter scan range, or a combination thereof. For example, cross-point fitter can set the parameter scan range by: defining the lower bound of the parameter scan range at $-\pi$ radians, defining the upper bound of the parameter scan range at $\pi$ radians, or a combination thereof. At 620, initial state component 432 can prepare a pair of initial stabilizer states ($\psi\pm$) corresponding to a target Pauli term.

At 630, cross-point fitter 427 can receive counts data from readout unit 450 that can be obtained by manipulating quantum processor 440 with an RF signal comprising an echo sequence that waveform generator 425 generates using the number of echo sequence repetitions, the parameter scan range, and/or the pair of initial stabilizer states. Cross-point fitter 427 can evaluate that counts data obtained from readout unit 450 to determine a parameter error. Cross-point fitter 427 can determine the parameter error by identifying a cross point between a pair of calibration curves within the parameter scan range set at 610. At 640, cross-point fitter 427 can compare the parameter error determined at 630 with a defined threshold value for parameter errors. If the comparison at 640 indicates that the parameter error is less than that defined threshold value, operational flow 600 proceeds to 650. Alternatively, if the comparison at 640 indicates that the parameter error is at or above that defined threshold value, operational flow 600 proceeds to 660.

At 650, cross-point fitter 427 can set a calibration success flag of status register 429. In an embodiment, cross-point fitter 427 can also identify an optimal pulse parameter based on the parameter error, at 650. At 660, cross-point fitter 427 can compare a current number of echo sequence repetitions (e.g., the number of echo sequence repetitions set at 610) with a defined threshold value for echo sequence repetitions.

If the comparison at 660 indicates that the current number of echo sequence repetitions is less than that defined threshold value, operational flow 600 proceeds to 670. Alternatively, if the comparison at 660 indicates that the current number of echo sequence repetitions is at or above that defined threshold value, operational flow 600 proceeds to 680.

At 670, cross-point fitter 427 updates a parameter value of waveform generator 425 based on the parameter error determined at 630. Cross-point fitter 427 further increases (or increments) the current number of echo sequence repetitions, at 670. For example, if the current number of echo sequence repetitions is one, cross-point fitter 427 can increase the current number of echo sequence repetitions from one to two. At 670, cross-point fitter 427 also reduces a current parameter scan range by increasing a lower bound of the current parameter scan range, decreasing an upper bound of the current parameter scan range, or a combination thereof. For example, the current parameter scan range can have a lower bound of $-\pi$ radians and an upper bound of $\pi$ radians. In this example, cross-point fitter 427 can reduce the current parameter scan range by increasing the lower bound from $-\pi$ radians to $-\pi/2$ radians, by decreasing the upper bound from $\pi$ radians to $\pi/2$ radians, or a combination thereof.

Figure 7:
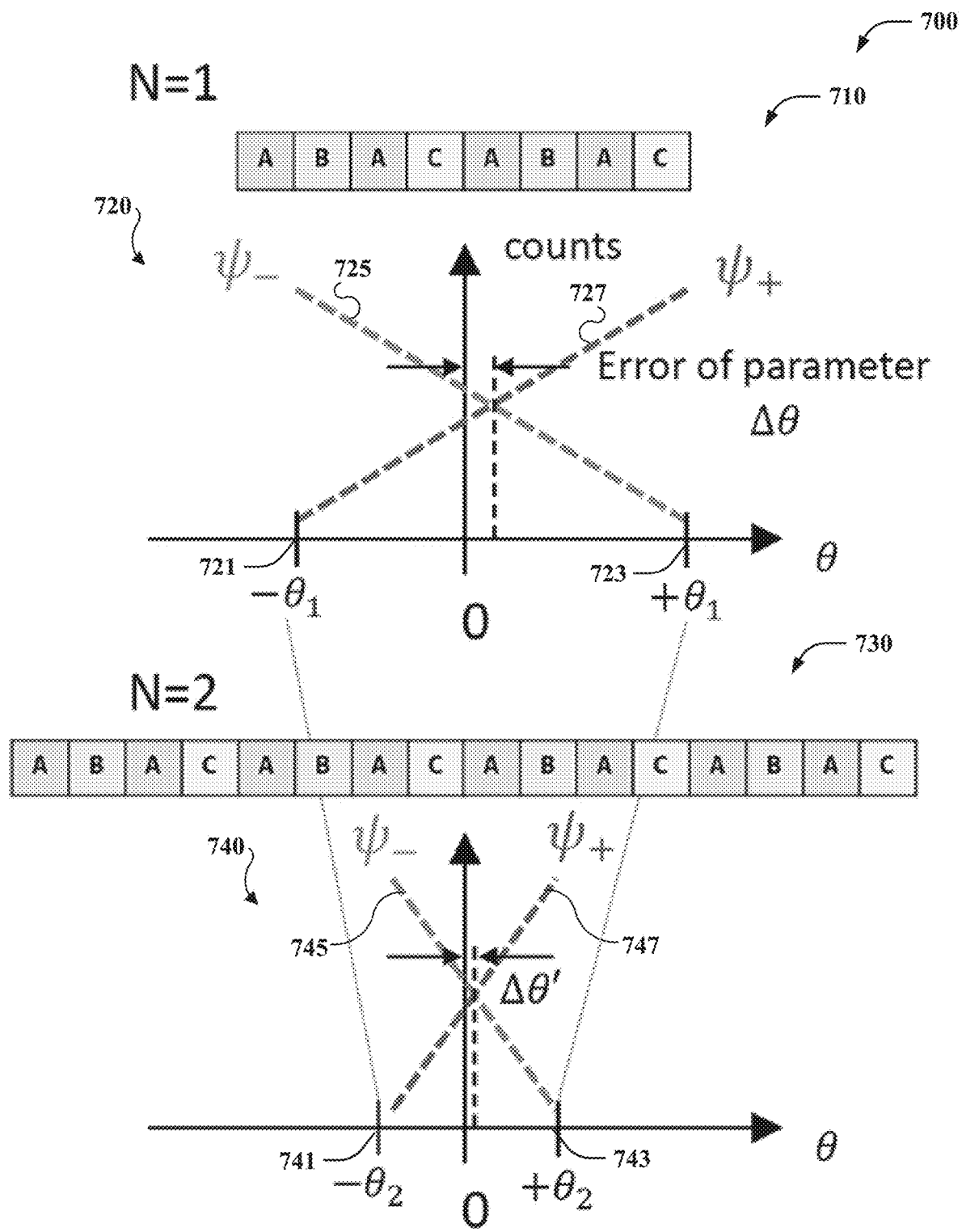
FIG. 7 illustrates an example, non-limiting schematic diagram depicting scanning iterations of a cross-point calibration process, in accordance with one or more embodiments described herein.

FIG. 7 illustrates an example, non-limiting schematic diagram 700 depicting two scanning iterations of a cross-point calibration process, in accordance with one or more embodiments described herein. In FIG. 7, cross-point fitter 427 set a number of echo sequence repetitions for a first scanning iteration 710 to one. Cross-point fitter 427 further set a scan parameter range for the first scanning iteration 710 that is defined by a lower bound 721 ($-\Theta_1$) and an upper bound 723 ($+\Theta_1$). Cross-point fitter 427 can evaluate counts data 720 obtained from readout unit 450 to determine a parameter error ($\Delta\Theta$) for the first scanning iteration 710. To that end, cross-point fitter 427 can identify a cross point between a pair of calibration curves within the parameter scan range defined by lower and upper bounds 721 and 723, respectively. The pair of calibration curves can include a calibration curve 725 comprising state data associated with a probe qubit that can be obtained with one initial stabilizer state for a controller qubit among a pair of initial stabilizer states. The pair of calibration curves can further include a calibration curve 727 comprising state data associated with the probe qubit that can be obtained with the other initial stabilizer state for the controller qubit among the pair of initial stabilizer states. The parameter error for the first scanning iteration 710 can correspond with a parameter value where calibration curves 725 and 727 overlap within the parameter scan range defined by lower and upper bounds 721 and 723, respectively. In an embodiment, cross-point fitter 427 can identify the cross point between the pair of calibration curves utilizing linear fitting.

A comparison with a defined threshold value can indicate that the parameter error for the first scanning iteration 710 is at or above that defined threshold value. As such, cross-point fitter 427 can facilitate increased sensitivity tuning for a second scanning iteration 730 by increasing the number of echo sequence repetitions from one to two. Cross-point fitter 427 can further facilitate increased sensitivity tuning by reducing a parameter scan range for the second scanning iteration 730 that is defined by a lower bound 741 ($-\Theta_2$) and an upper bound 743 ($+\Theta_2$). Cross-point fitter 427 can evaluate counts data 740 obtained from readout unit 450 to determine a parameter error ($\Delta\Theta'$) for the second scanning iteration 730. To that end, cross-point fitter 427 can identify a cross point between a pair of calibration curves within the parameter scan range defined by lower and upper bounds 741 and 743, respectively. The pair of calibration curves can include a calibration curve 745 comprising state data associated with a probe qubit that can be obtained with one initial stabilizer state for a controller qubit among a pair of initial stabilizer states. The pair of calibration curves can further include a calibration curve 747 comprising state data associated with the probe qubit that can be obtained with the other initial stabilizer state for the controller qubit among the pair of initial stabilizer states. The parameter error for the second scanning iteration 730 can correspond with a parameter value where calibration curves 745 and 747 overlap within the parameter scan range defined by lower and upper bounds 741 and 743, respectively.

Figure 8:
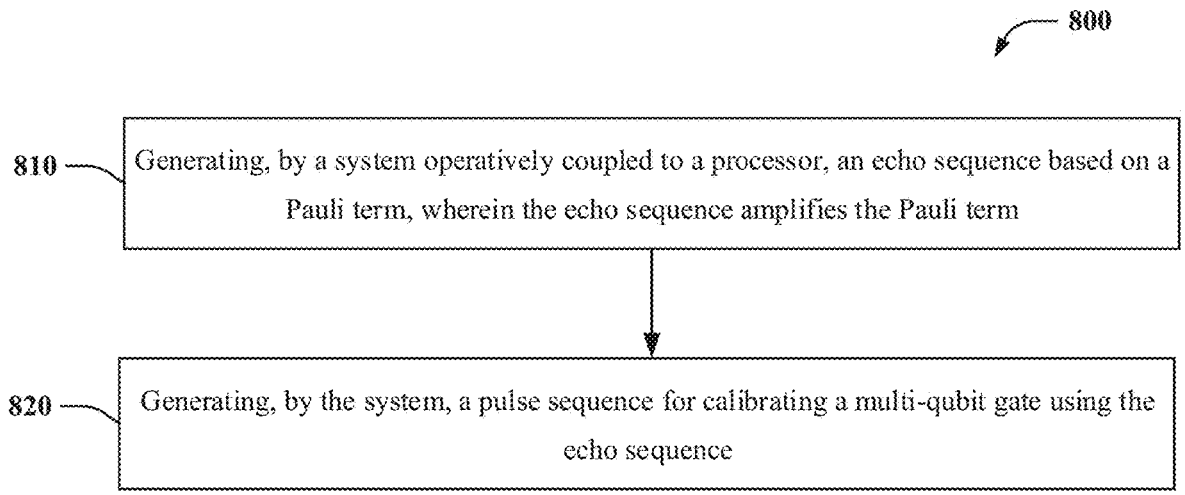
FIG. 8 illustrates a flow diagram of an example, non-limiting computer-implemented method that can facilitate hardware-efficient calibration protocols for quantum computing devices, in accordance with one or more embodiments described herein.

FIG. 8 illustrates a flow diagram of an example, non-limiting computer-implemented method 800 of facilitating hardware-efficient calibration protocols for quantum computing devices, in accordance with one or more embodiments described herein. Repetitive description of like elements employed in other embodiments described herein is omitted for sake of brevity. At 810, the computer-implemented method 800 can comprise generating, by a system operatively coupled to a processor (e.g., using echo pattern component 140), an echo sequence based on a Pauli term, wherein the echo sequence amplifies the Pauli term. In an embodiment, generating the echo sequence comprises finding, by the system, a maximum clique with anti-commutation elements of a commutation set comprising the Pauli term. In an embodiment, generating the echo sequence comprises sequentially arranging, by the system, a reduced commutation set of Pauli terms to form a sequence of Pauli terms. In an embodiment, generating the echo sequence comprises appending, by the system, a final Pauli term to the sequence of Pauli terms to generate the echo sequence, wherein the final Pauli term renders the echo sequence unitary. In an embodiment, the system generates the echo sequence using a reduced commutation set comprising a subset of a commutation set, and wherein the reduced commutation set facilitates reducing a length of the echo sequence.

At 820, the computer-implemented method 800 can comprise generating, by the system (e.g., using pulse component 150), a pulse sequence for calibrating a multi-qubit gate using the echo sequence. In an embodiment, the computer-implemented method 800 can further comprise identifying, by the system (e.g., using cross-point component 160), an optimal pulse parameter within a parameter scan range using a cross point between a pair of calibration curves. In an embodiment, the computer-implemented method 800 can further comprise reducing, by the system, an error associated with the optimal pulse parameter by increasing a number of echo sequence repetitions and reducing the parameter scan range.

Figure 9:
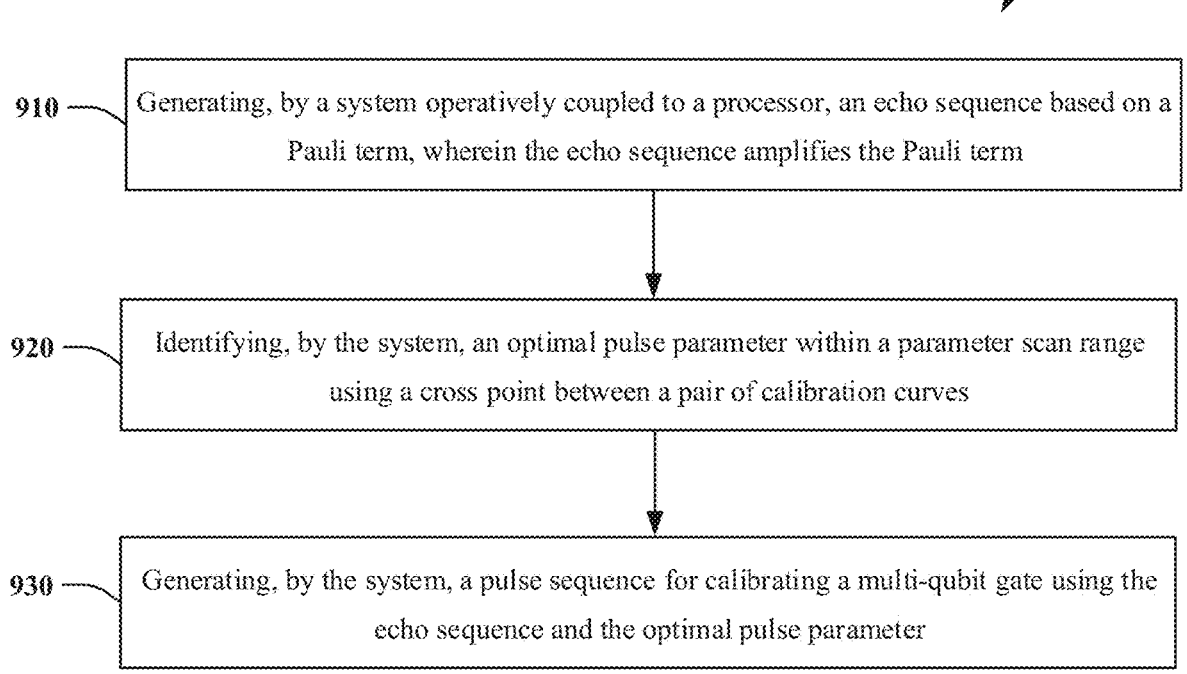
FIG. 9 illustrates a flow diagram of another example, non-limiting computer-implemented method that can facilitate hardware-efficient calibration protocols for quantum computing devices, in accordance with one or more embodiments described herein.

FIG. 9 illustrates a flow diagram of an example, non-limiting computer-implemented method 900 of facilitating hardware-efficient calibration protocols for quantum computing devices, in accordance with one or more embodiments described herein. Repetitive description of like elements employed in other embodiments described herein is omitted for sake of brevity. At 910, the computer-implemented method 900 can comprise generating, by a system operatively coupled to a processor (e.g., using echo pattern component 140), an echo sequence based on a Pauli term, wherein the echo sequence amplifies the Pauli term. At 920, the computer-implemented method 900 can comprise identifying, by the system (e.g., using cross-point component 160), an optimal pulse parameter within a parameter scan range using a cross point between a pair of calibration curves. At 930, the computer-implemented method 1100 can comprise generating, by the system (e.g., using pulse component 150), a pulse sequence for calibrating a multi-qubit gate using the echo sequence and the optimal pulse parameter.

Figure 10:
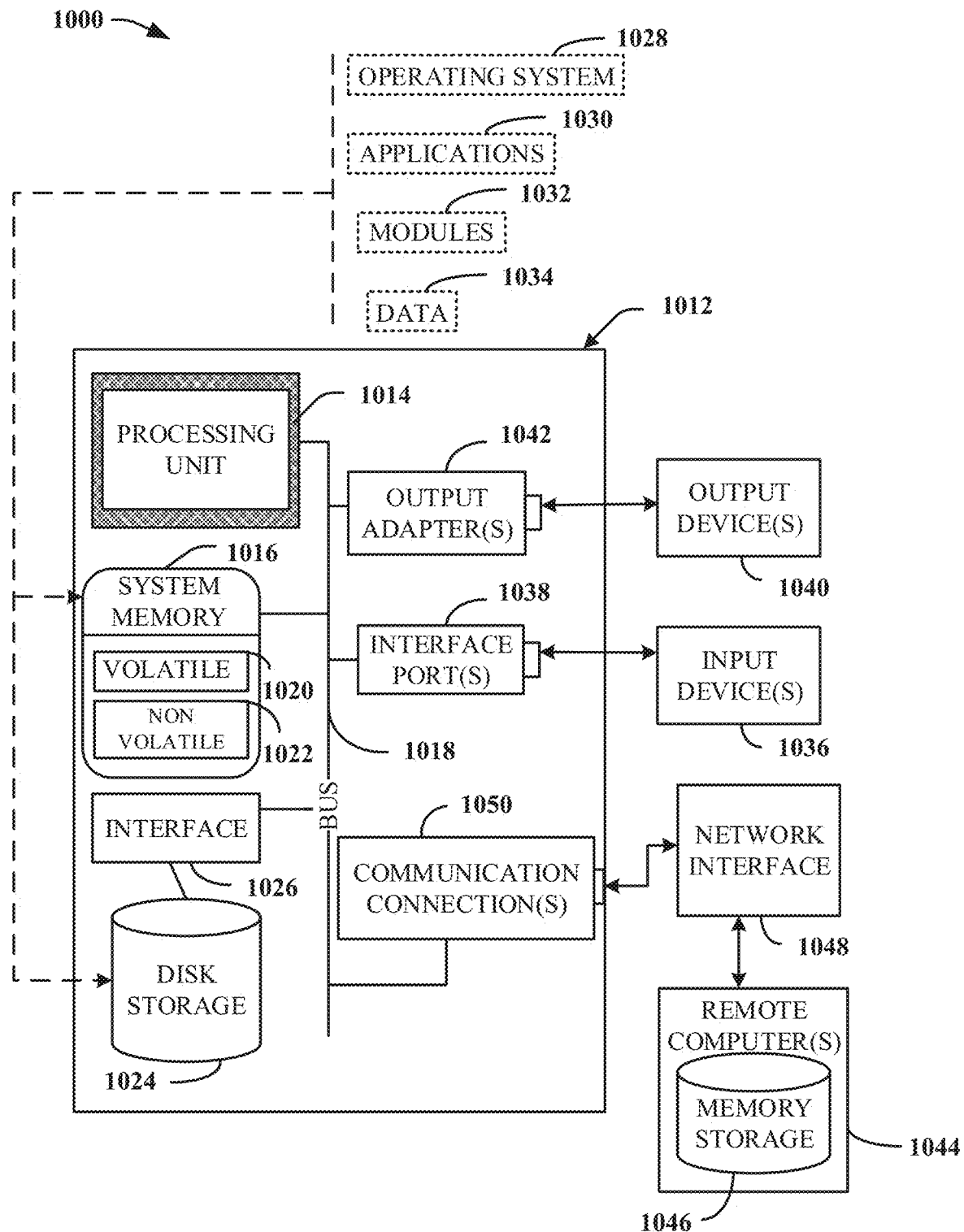
FIG. 10 illustrates a block diagram of an example, non-limiting operating environment in which one or more embodiments described herein can be facilitated.

In order to provide a context for the various aspects of the disclosed subject matter, FIG. 10 as well as the following discussion are intended to provide a general description of a suitable environment in which the various aspects of the disclosed subject matter can be implemented. FIG. 10 illustrates a suitable operating environment 1000 for implementing various aspects of this disclosure can also include a computer 1012. The computer 1012 can also include a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014. The system bus 1018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1094), and Small Computer Systems Interface (SCSI). The system memory 1016 can also include volatile memory 1020 and nonvolatile memory 1022. The basic input/output system (BIOS), containing the basic routines to transfer information between elements within the computer 1012, such as during start-up, is stored in nonvolatile memory 1022. By way of illustration, and not limitation, nonvolatile memory 1022 can include read only memory (ROM), programmable ROM (PROM), electrically programmable ROM (EPROM), electrically erasable programmable ROM (EEPROM), flash memory, or nonvolatile random-access memory (RAM) (e.g., ferroelectric RAM (FeRAM). Volatile memory 1020 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1012 can also include removable/non-removable, volatile/nonvolatile computer storage media. FIG. 10 illustrates, for example, a disk storage 1024. Disk storage 1024 can also include, but is not limited to, devices like a magnetic disk drive, floppy disk drive, tape drive, Jaz drive, Zip drive, LS-100 drive, flash memory card, or memory stick. The disk storage 1024 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1024 to the system bus 1018, a removable or non-removable interface is typically used, such as interface 1026. FIG. 10 also depicts software that acts as an intermediary between users and the basic computer resources described in the suitable operating environment 1000. Such software can also include, for example, an operating system 1028. Operating system 1028, which can be stored on disk storage 1024, acts to control and allocate resources of the computer 1012. System applications 1030 take advantage of the management of resources by operating system 1028 through program modules 1032 and program data 1034, e.g., stored either in system memory 1016 or on disk storage 1024. It is to be appreciated that this disclosure can be implemented with various operating systems or combinations of operating systems. A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port can be used to provide input to computer 1012, and to output information from computer 1012 to an output device 1040. Output adapter 1042 is provided to illustrate that there are some output devices 1040 like monitors, speakers, and printers, among other output devices 1040, which require special adapters. The output adapters 1042 include, by way of illustration and not limitation, video and sound cards that provide a means of connection between the output device 1040 and the system bus 1018. It can be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a computer, a server, a router, a network PC, a workstation, a microprocessor-based appliance, a peer device or other common network node and the like, and typically can also include many or the elements described relative to computer 1012. For purposes of brevity, only a memory storage device 1046 is illustrated with remote computer(s) 1044. Remote computer(s) 1044 is logically connected to computer 1012 through a network interface 1048 and then physically connected via communication connection 1050. Network interface 1048 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1050 refers to the hardware/software employed to connect the network interface 1048 to the system bus 1018. While communication connection 1050 is shown for illustrative clarity inside computer 1012, it can also be external to computer 1012. The hardware/software for connection to the network interface 1048 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc.

that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," "data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DR-RAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
a processor that executes computer executable components stored in a memory, wherein the computer executable components comprise:
an echo pattern component that generates an echo sequence based on a Pauli term, wherein the echo sequence amplifies the Pauli term; and
a pulse component that generates a pulse sequence to calibrate a multi-qubit gate using the echo sequence.

2. The system of claim 1, wherein the echo pattern component generates the echo sequence using a commutation set comprising the Pauli term and a plurality of Pauli terms that each commute with the Pauli term, wherein at least one Pauli term within the plurality of Pauli terms anti-commutes with remaining Pauli terms in the plurality of Pauli terms.

3. The system of claim 1, wherein the echo pattern component generates the echo sequence using a reduced commutation set comprising a subset of a commutation set, and wherein the reduced commutation set facilitates reducing a length of the echo sequence.

4. The system of claim 1, further comprising:
a cross-point component that identifies a pulse parameter within a parameter scan range using a cross point between a pair of calibration curves.

5. The system of claim 4, wherein the cross-point component further reduces an error associated with the pulse parameter by increasing a number of echo sequence repetitions and reducing the parameter scan range.

6. The system of claim 1, further comprising an initial state component that determines a pair of initial stabilizer states using the Pauli term.

7. The system of claim 1, further comprising a measurement basis component that determines a projection basis of a qubit using the Pauli term.

8. The system of claim 1, wherein the Pauli term is determined for an input calibration parameter using a hard-coded lookup table.

9. The system of claim 1, wherein the multi-qubit gate is comprised of a plurality of qubits, the system further comprising:
a controller unit that is coupled to one or more qubits of the plurality of qubits, wherein the controller unit includes the processor.

10. The system of claim 9, wherein the controller unit is managed by a host processor, and wherein communication between the host processor and the controller unit utilizes bit-strings encoding Pauli terms.

11. A computer-implemented method, comprising:
generating, by a system operatively coupled to a processor, an echo sequence based on a Pauli term, wherein the echo sequence amplifies the Pauli term; and
generating, by the system, a pulse sequence to calibrate a multi-qubit gate using the echo sequence.

12. The computer-implemented method of claim 11, further comprising:
identifying, by the system, an optimal pulse parameter within a parameter scan range using a cross point between a pair of calibration curves.

13. The computer-implemented method of claim 11, wherein the generating the echo sequence comprises finding, by the system, a maximum clique with anti-commutation elements of a commutation set comprising the Pauli term.

14. The computer-implemented method of claim 11, wherein the generating the echo sequence comprises:
sequentially arranging, by the system, a reduced commutation set of Pauli terms to form a sequence of Pauli terms, wherein the reduced commutation set is a first size and a commutation set is a second size, and wherein the first size is less than the second size; and
appending, by the system, a final Pauli term to the sequence of Pauli terms to generate the echo sequence, wherein the final Pauli term renders the echo sequence unitary.

15. The computer-implemented method of claim 11, wherein the generating the echo sequence comprises using a reduced commutation set comprising a subset of a commutation set, and wherein the reduced commutation set facilitates reducing a length of the echo sequence.

16. The computer-implemented method of claim 12, further comprising:
reducing, by the system, an error associated with the optimal pulse parameter by increasing a number of echo sequence repetitions and reducing the parameter scan range.

17. A computer program product for hardware-efficient calibration of quantum computing devices, the computer program product comprising a computer readable storage medium having program instructions embodied therewith, the program instructions executable by a processor to cause the processor to:
generate an echo sequence based on a Pauli term, wherein the echo sequence amplifies the Pauli term; and
generate a pulse sequence to calibrate a multi-qubit gate using the echo sequence.

18. The computer program product of claim 17, the program instructions executable by the processor to further cause the processor to:
identify a pulse parameter within a parameter scan range using a cross point between a pair of calibration curves.

19. The computer program product of claim 18, the program instructions executable by the processor to further cause the processor to:
  reduce an error associated with the pulse parameter by increasing a number of echo sequence repetitions and reducing the parameter scan range.

20. The computer program product of claim 17, wherein the processor generates the echo sequence using a reduced commutation set comprising a subset of a commutation set, wherein the reduced commutation set is a first size and the commutation set is a second size, wherein the first size is less than the second size, and wherein the reduced commutation set facilitates reducing a length of the echo sequence.

21. The computer program product of claim 17, wherein the echo sequence is stored in memory, and wherein the processor retrieves the echo sequence from the memory to generate the pulse sequence.

\* \* \* \* \*